(12) United States Patent
Geurts et al.

(10) Patent No.: US 9,837,246 B1
(45) Date of Patent: Dec. 5, 2017

(54) REINFORCED SAMPLE FOR TRANSMISSION ELECTRON MICROSCOPE

(71) Applicant: FEI Company, Hillsboro, OR (US)

(72) Inventors: Remco Theodorus Johannes Petrus Geurts, Eindhoven (NL); Tomas Vystavel, Brno (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 15/217,968

(22) Filed: Jul. 22, 2016

(51) Int. Cl.
| | |
|---|---|
| *G03F 1/26* | (2012.01) |
| *G03F 1/62* | (2012.01) |
| *C09K 13/00* | (2006.01) |
| *H01J 37/302* | (2006.01) |
| *H01J 37/31* | (2006.01) |

(52) U.S. Cl.
CPC .......... *H01J 37/3023* (2013.01); *H01J 37/31* (2013.01); *H01J 2237/3174* (2013.01)

(58) Field of Classification Search
USPC ..... 250/491.1, 492.1, 492.21, 492.22, 492.3, 250/526; 430/322, 323, 644
See application file for complete search history.

(56) References Cited

U.S. PATENT DOCUMENTS

| | | | |
|---|---|---|---|
| 5,435,850 A | 7/1995 | Rasmussen | |
| 5,563,412 A | 10/1996 | Zandbergen et al. | |
| 5,851,413 A | 12/1998 | Casella et al. | |
| 6,399,944 B1 | 6/2002 | Vasilyev et al. | |
| 7,140,084 B2 * | 11/2006 | Yamada | B06B 1/0644 29/25.35 |
| 7,252,698 B2 * | 8/2007 | Mirkin | B22F 1/0088 148/430 |
| 7,611,562 B2 * | 11/2009 | Mirkin | B22F 1/0088 75/342 |
| 8,304,147 B2 * | 11/2012 | Iwashita | G03F 1/46 430/5 |
| 8,329,364 B2 * | 12/2012 | Iwashita | G03F 1/58 430/5 |
| 8,389,955 B2 * | 3/2013 | Lehmann | H01J 37/20 250/440.11 |
| 8,399,831 B2 * | 3/2013 | Faber | G01N 1/286 250/306 |
| 9,005,851 B2 * | 4/2015 | Iwashita | G03F 1/26 430/5 |

(Continued)

FOREIGN PATENT DOCUMENTS

| | | |
|---|---|---|
| EP | 2413126 A2 | 2/2012 |
| WO | 2014110379 A1 | 7/2014 |

*Primary Examiner* — Bernard Souw
(74) *Attorney, Agent, or Firm* — Scheinberg & Associates, P.C.; Michael O. Scheinberg (57) ABSTRACT

A lamella for observation on a transmission electron microscope and other analytical instruments includes multiple thin regions separated by thicker regions or ribs. In some embodiments, the lamella can be wider than 50 μm with more than 10 multiple thin regions, with each thin region may being as thin as 10 nm or even thinner. The process for making such lamellae lends itself to automation. The process is fault tolerant in that not all of the multiple thin regions need to be useable as long as one region provides a useful image. Redeposition is reduced because ion beam imaging is reduced in the automated process and because the ribs reduce redeposition between regions.

23 Claims, 8 Drawing Sheets

(56) References Cited

U.S. PATENT DOCUMENTS

| | | | |
|---|---|---|---|
| 9,006,651 B2* | 4/2015 | Blackwood | G01N 1/32 250/304 |
| 9,588,416 B2* | 3/2017 | Englund | G03F 1/62 |
| 2006/0099519 A1 | 5/2006 | Moriarty et al. | |
| 2008/0185286 A1 | 8/2008 | Lehmann | |
| 2010/0032567 A1 | 2/2010 | Freitag et al. | |
| 2010/0116977 A1 | 5/2010 | Young et al. | |
| 2010/0243889 A1 | 9/2010 | Faber et al. | |
| 2012/0214124 A1 | 8/2012 | McLelland et al. | |
| 2013/0143412 A1 | 6/2013 | Moriarty et al. | |
| 2013/0319849 A1 | 12/2013 | Fuller et al. | |
| 2014/0007307 A1 | 1/2014 | Routh et al. | |
| 2014/0217283 A1 | 8/2014 | Blackwood et al. | |
| 2016/0141147 A1 | 5/2016 | Brogden et al. | |
| 2016/0199878 A1 | 7/2016 | Vystavel et al. | |

* cited by examiner

REINFORCED SAMPLE FOR TRANSMISSION ELECTRON MICROSCOPE

TECHNICAL FIELD OF THE INVENTION

The present invention relates to the preparation of thin samples, such as those required for transmission electron microscopy (TEM) and scanning transmission electron microscopy (STEM).

BACKGROUND OF THE INVENTION

Semiconductor circuit fabrication methods, as well as other microscopic and nanoscopic manufacturing techniques, have required the development of new imaging techniques, having improved resolution. Improved imaging techniques are also needed in the life sciences. Charged particle beam microscopy, such as electron microscopy and ion microscopy, provides significantly higher resolution and greater depth of focus than optical microscopy. In a scanning electron microscope (SEM), a primary electron beam is focused to a fine spot that scans the surface to be observed. Secondary electrons are emitted from the surface as it is impacted by the primary electron beam. The secondary electrons are detected, and an image is formed, with the brightness at each point on the image being determined by the number of secondary electrons detected when the beam impacts a corresponding spot on the surface. SEMs can also form images from back-scattered electrons as an alternative to secondary electrons. Scanning ion microscopy (SIM) is similar to scanning electron microscopy, but an ion beam is used to scan the surface and eject the secondary electrons. Ion microscopes are also able to form images using secondary ions.

In a transmission electron microscope (TEM), a broad electron beam impacts the sample and electrons that are transmitted through the sample are focused to form an image of the sample. The sample must be sufficiently thin to allow many of the electrons in the primary beam to travel though the sample and exit on the opposite site. Samples are typically less than 200 nm thick and often much thinner.

In a scanning transmission electron microscope (STEM), a primary electron beam is focused to a fine spot, and the spot is scanned across the sample surface. Electrons that are transmitted through the work piece are collected by an electron detector on the far side of the sample, and the intensity of each point on the image corresponds to the number of electrons collected as the primary beam impacts a corresponding point on the surface. The term "TEM" sample as used herein refers to a sample for either a TEM or an STEM and references to preparing a sample for a TEM are to be understood to also include preparing a sample for viewing on an STEM.

Because TEM samples are very thin, preparation of the samples is delicate, time consuming work. Thickness variations in thin samples, particularly samples less than 100 nm thick, can result in sample bending, over-milling, or other catastrophic defects. The preparation technique determines the quality of structural characterization and the ability to analyze the smallest and most critical structures.

Several techniques are known for preparing TEM samples. Some techniques may involve cleaving, followed by chemical polishing, mechanical polishing, or broad beam low energy ion milling. Combinations of these techniques are also possible. These methods are disadvantageous because they require that the starting material be sectioned into smaller and smaller pieces, thereby destroying much of the original sample. They are also generally not specific to a particular site on the sample.

Other techniques generally referred to as "lift-out" procedures use a focused ion beam (FIB) to cut the sample from a substrate while greatly limiting or eliminating damage to surrounding areas of the substrate. These techniques are useful for analyzing the results of semiconductor manufacture, for example. Using lift-out techniques, a sample of any orientation within the work piece can be extracted and analyzed. That is, a sample can be formed that is perpendicular to the surface ("cross-sectional sample") or parallel to the surface ("plan view sample"). Some techniques extract a sample that is sufficiently thin for use in a TEM without additional preparation.

Techniques in which the sample is extracted from the substrate and moved to a sample holder within the FIB vacuum chamber are referred to as "in-situ" techniques. Techniques in which the sample is removed from the work piece and moved to a sample holder after the work piece is removed from the vacuum chamber are referred to as "ex-situ" techniques.

Figure 8:
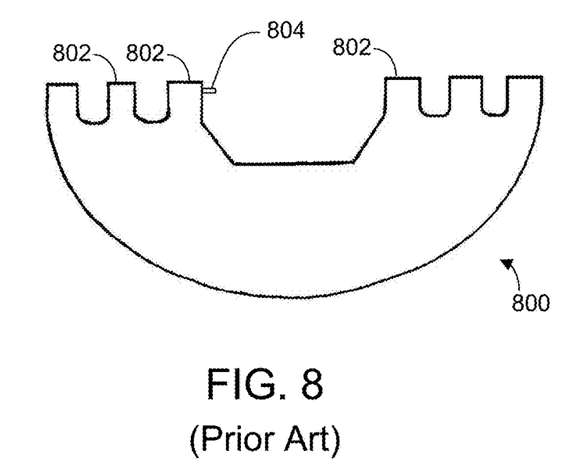
FIG. 8 is an illustration of a prior art TEM sample grid.

A cross-sectional sample is typically prepared from a larger bulk sample by milling away material with an ion beam to create trenches on either side of the region of interest, leaving a thin section referred to as a "lamella." The lamella is partly severed from the sample substrate by ion beam milling around the bottom and the sides of the lamella until it is connected to the substrate only by a small amount of material. In some cases, the connecting material might be "tabs" on either side. In an in-situ process, a sample manipulation probe is then brought in close proximity to the thin sample. The probe is attached to the thin sample, typically by beam-induced deposition of a material from a precursor gas, but other methods can be used, such as electrostatic attachment. Beam deposition can be done with either the FIB or SEM. The material connecting the thin sample to the work piece is then milled away (or mechanically broken) to leave the sample connected only to the manipulation probe. The probe, with the sample attached, can then be moved to a different position where the sample can be attached to a TEM sample holder, called a "TEM grid." FIG. 8 shows a TEM grid 800 having tines 802 to which a lamella 804 is attached. The probe is brought into contact with, or very close to, a selected part of the TEM grid, and the lamella is attached to the grid, typically by beam-induced deposition. Once the sample has been attached to the grid, the probe can be disconnected from the sample, for example, by severing the connection with the FIB or merely by moving the probe or the work piece to break the connection. The lamella may be processed further after attachment to the grid.

The process of creating and extracting a lamella and transferring it to the sample grid is a delicate and time-consuming procedure, often requiring about 45 to 90 minutes to create a single lamella, and requiring the constant attention of a skilled operator. For total analysis of an area of interest on a semiconductor wafer, it is may be desirable to analyze as many as 15 to 50 or more TEM samples. When so many samples must be extracted and measured, the total time to process the samples from one area can be hours or even days. Thus, even though the information that can be gained through TEM analysis can be very valuable, the process has been prohibitively time consuming for manufacturing process control and other routine procedures.

Improving the speed at which lamellae can be prepared for imaging therefore would provide significant advantages in both time and potential revenue by allowing work pieces selected for analysis to return to the production line more quickly. Automation of the lamella preparation process would not only speed up the process but also increase the percentage of useable lamella while reducing the level of expertise required for operators.

Due to the precision required to mill, extract, transfer, and deposit a lamella on a sample grid, the process has not adapted itself to automation. As the lamella thickness is reduced, it becomes more likely that the region of interest will be excluded from the lamella. Lamellae are typically less than 100 nm thick, but for some applications a lamella must be considerably thinner. Lamellae under 100 nm in thickness, particularly lamellae under 70 nm, are difficult to produce either manually or automatically.

In the semiconductor industry, TEM and STEM analysis is becoming especially important to characterize the smallest and most critical structures. Lamella preparation is a critical step in TEM analysis. The continuing demand to reduce the size of transistors results in the need to further decrease the thickness of lamellae to provide samples that contain one discrete transistor structure only. The minimum feature size or "pitch" used in semiconductor manufacturing is moving toward 22 nm, so it will be desirable to produce lamella having a thickness of around 10 nm. Lamellae having thicknesses of less than 20 nm are challenging to produce in a reliable and repeatable manner. The success rate of lamella samples decreases dramatically as the thickness decreases, for example, to less than 10 nm. Such thin lamellae are subject to mechanical failure due to the lack of structural integrity—warping, bending, and erosion of critical areas often occurs in very thin samples. Since the required thickness of lamellae is decreasing, there is a need for a method of providing and maintaining structural integrity of thin samples.

Thin lamellae can warp due to thermal or mechanical stress, changing their positions relative to the beam, which can ruin the lamella by allowing the ion beam to impact the region of interest. Lamella stress is one of the most, if not the most, difficult challenge to overcome during TEM sample preparation. As a result of stress:

lamella thinning has to be stopped before the final thickness is achieved and the achievable final thickness is limited;

internal stress complicates TEM imaging; and continuing only shortly can result in re-deposition on the area of interest.

The maximum width of a lamella that can be thinned is limited and therefore the area of observation by TEM. A typical lamella in a FIB is limited to 15-20 μm for stability reasons.

Thickness variations in the lamella can result in sample bending, over-milling, or other catastrophic defects that render the sample useless. In addition, the sample probe for manipulation of the lamella must be placed with extreme precision when preparing to extract the lamella from the substrate, and also when landing the lamella on the sample grid. These factors combine to make the preparation of lamella for analysis an exceedingly difficult process to automate.

The accuracy of lamella thickness and the final lamella center location are based on the accuracy of the placement of FIB milling operations. In an automated work flow, milling is typically performed with respect to some feature or fiducial on the top surface of the substrate from which the TEM sample lamella is to be milled.

Prior art lamella reinforcing techniques, such as the method taught by Lechner in EP 2413126, involve shaping the lamella to leave certain areas thicker than others for structural support. Such methods leave "windows" of thinner regions surrounded by thicker regions, but such windows can limit the field of view which in turn affects the amount of information that can be obtained from the lamella. Windowing also adds complexity and process time. Further, a high level of operator skill is required to direct the focused ion beam to different regions to leave varying levels of thickness within the lamella. The Lechner method also limits the field of view and site specifity is lost.

WO2014/110379 describes reinforcing a lamella by implanting beryllium into lines on the lamella before final thinning. The implanted beryllium makes the implanted pattern resistant to etching, and so creates a pattern of thicker regions to reinforce the lamella when the lamella is thinned. The implanted atoms can affect the properties of the observed sample, in particular, the beryllium implantation can damage metal layers of an integrated circuit. Moreover, implanting beryllium, however, is an extra processing step, and a means of implanting beryllium may not be readily available. Thus, what is needed is an improved method and apparatus to reinforce lamella samples.

Milling thin windows in lamellae manually is a very slow manual process. Thickness and depth are hard to control, easily resulting in over-milling. The size between windows are not controllable resulting in less observation areas for TEM.

SUMMARY OF THE INVENTION

An object of the invention is to produce lamellae for TEM viewing.

A TEM sample is prepared that includes multiple thinned areas separated by ribs that provide mechanical reinforcement that prevents the lamella from warping.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

A lamella comprises a series of thin regions separated by thicker regions, referred to as "ribs." The ribs maintain the mechanical integrity of the lamella. The prior art produced a single or sometimes two thin window regions within a thicker lamella for observation. If the thinned window does not produce a good image of the region of interest, a new lamella must be created. The present invention can provide multiple thin windows for observation. The lamellae are produced by a dedicated composite pattern or a series of scripted patterns that can be used to automatically mill a thin parallel lamella separated by narrow ribs at the same time. The narrow ribs preserve the lamella integrity and prevents bending over a wide range of thicknesses and widths. Minimizing the rib size increases the observation area for TEM.

By milling a group of patterns at the same time, the size of the ribs can be reduced to the minimum and the variation of thickness is reduced, therefore reducing the need to monitor each individual window.

The process is scalable, workable on medium sized lamellae, around 15 µm, and large size lamellae, greater than 30 µm, greater than 50 µm, and as large as 100 µm or larger. The lamella can be produced using an ion beam system using a liquid metal ion source or using a focused ion beam system having a plasma source.

The throughput is significantly higher than prior art processes because the process eliminates the need for individual monitoring of each thinned area. Not monitoring eliminates the requirement of acquiring SEM images during the process and following the process manually. This saves time and allows for full automation. The probability of redeposition, which contaminates the lamella, is much lower. Redeposition is reduced by eliminating the requirement to use the ion beam to acquire images during the lamella formation process. Directing the ion beam toward sample, even for imaging, incidentally sputters material, which redeposited.

The method described herein approaches the thin window milling technique differently. Instead of milling thin windows, it leaves ribs. The present method lends itself to automatic, in which the milling sequence is performed by captured in a pattern or script, making it consistent.

Compared to prior art methods, the method described herein is more accurate, much faster, scalable, has a success rate which goes up significantly, can be easily automated (also for sensitive materials). The method described herein can produce wider lamella than prior art methods. The method reduces redeposition because the ribs block the redeposition onto regions that were previously thinned. An automated process also limits general ion beam exposure reducing the chance that any already polished areas are re-exposed to the ion beam. In a manual process, all areas are exposed several times for image alignment.

By thinning different regions of the lamella to different thicknesses, one lamella can now be used for multiple forms of characterization, including high resolution TEM, electron energy loss spectroscopy ("EELS"), energy dispersive x-ray spectroscopy ("EDS"), diffraction techniques, such as TEM Diffraction or SEM Transmission Kikuchi Diffraction (TKD). The success rate of preparation is higher than prior art methods—if one window is too thin, one can move to a slightly thicker window. Contrary to standard window thinning the windows thinned by this method will not show any redeposition in embodiments in which all the thinned regions are all milled at the same, that is, rather than completing the milling of each thin region before moving on to thin the next region, the beam moves from region to region, skipping over the ribs, and repeatedly milling a little from each region and until all regions are milled to the specified thickness. In embodiments in which the thin regions are thinned sequentially, the ribs reduce redeposition.

When the sample includes multiple structures next to one another, one can vary the exact position of the thin regions within the lamella slightly, mitigating for the need of exact manual endpointing. That is, the thin region can be positioned at difference differences from the front surface of the lamella. One could add an offset to match the periodicity of a semiconductor device in case of semiconductor sample preparation. When the area of interest is a few tens of nanometers, one could program the system to adjust the offset of the thin region to reduce the chance of inducing damage to the region of interest.

Milling a composite or scripted pattern is very fast, typically taking seconds, compared to milling manual windows, which typically takes minutes. The method is fast because it is unnecessary to observe the thinning process manually. The method facilitates automation because when multiple observation regions are formed, it becomes acceptable to have some of the multiple regions that cannot be used. There is likely to be at least one region that serves the observational purpose, even if others will not. This fault tolerance mitigates the need for extensive parameter optimization and tuning of the process.

While wedges are more often used to prevent bending, these limit quantitative analysis. Parallel sidewalls are a requirement for EELS and EDS, because of intensity differences or gradients from non-uniform thicknesses prevent quantification of peaks of different materials in the same area.

Figure 1A:
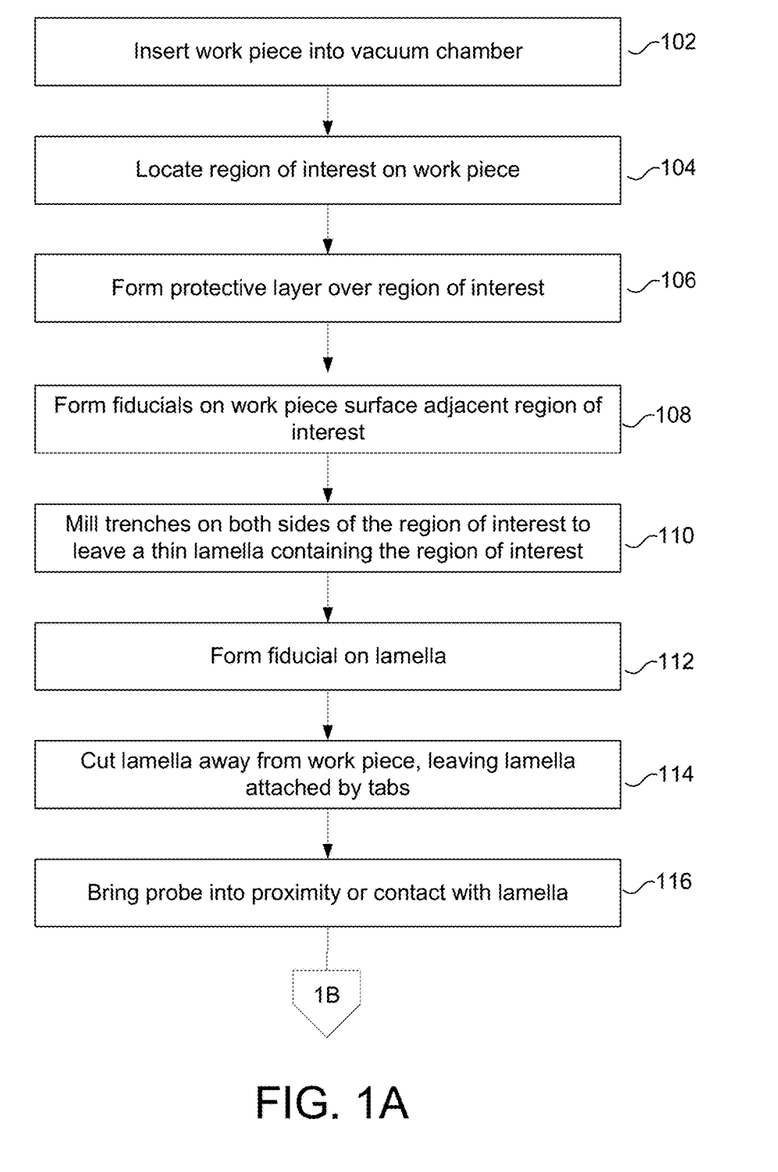
FIG. 1A is a flowchart showing some of the steps for preparing a lamella.
Figure 1B:
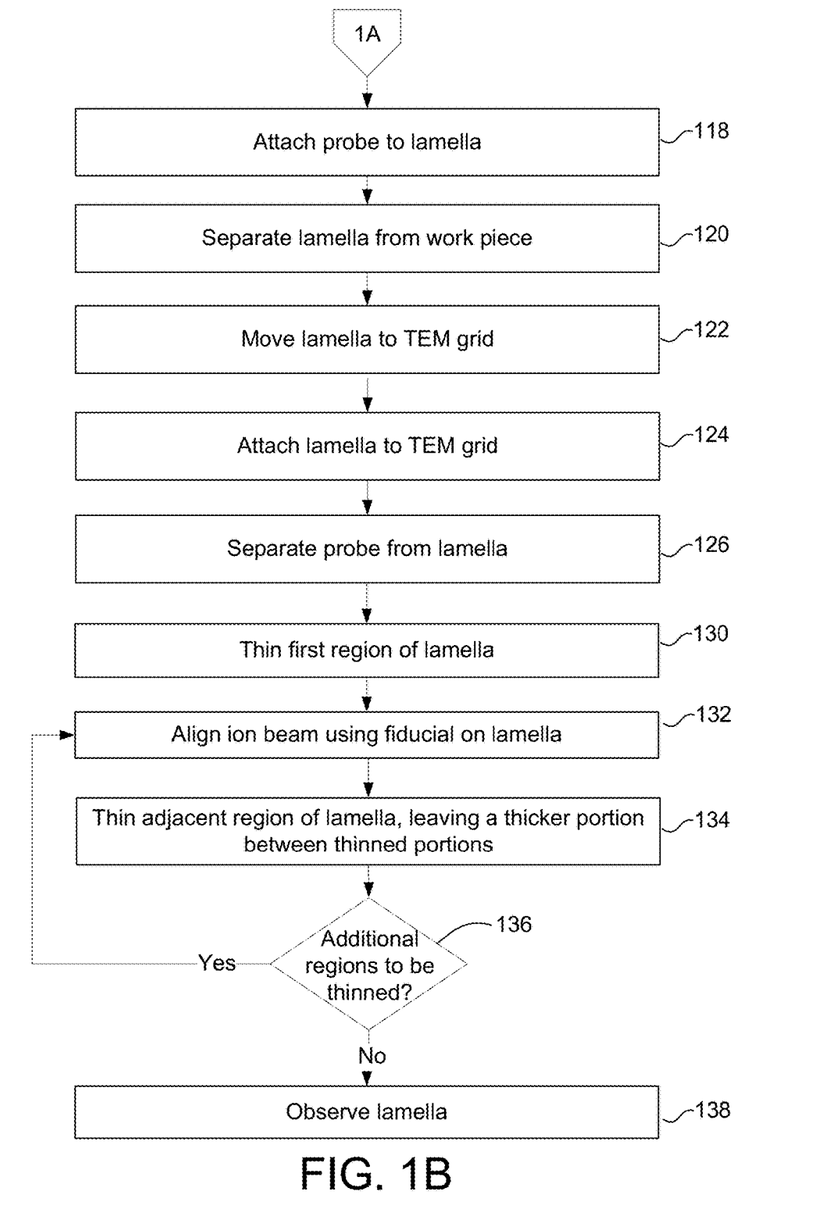
FIG. 1B shows additional steps used to prepare the lamella.
Figure 2A:
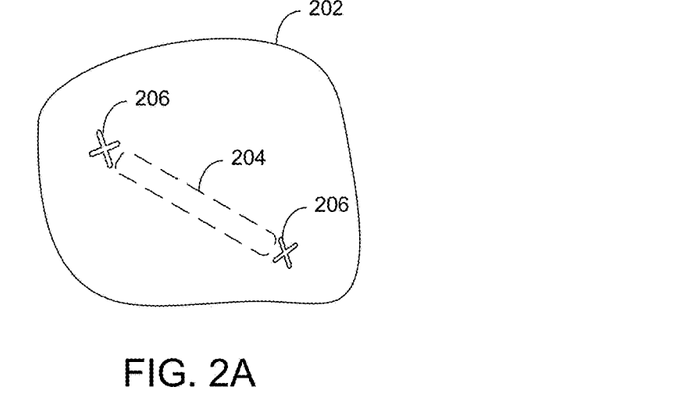
FIGS. 2A-2C shows a work piece in various stages of lamella preparation.
Figure 2B:
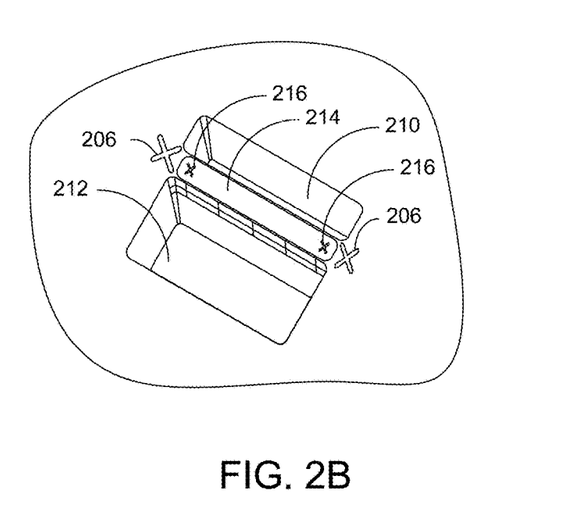
Figure 2C:
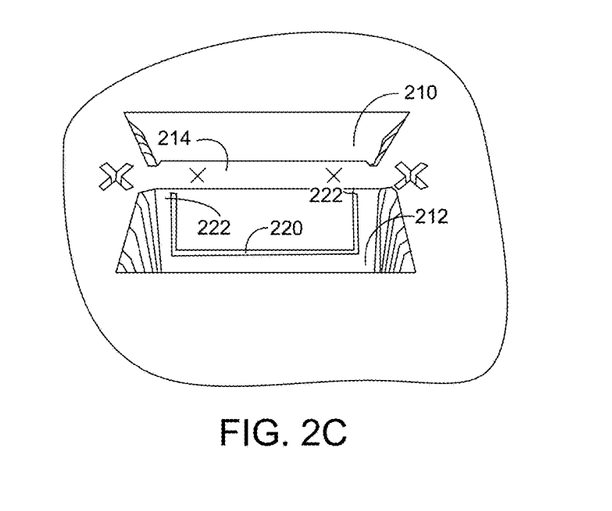

FIGS. 1A and 1B are flow charts showing an overview of the steps of a lamella fabrication process. FIGS. 2A to 2C shows the lamella during the processing steps of FIGS. 1A and 1B. In step 102, a work piece, such as a semiconductor wafer, is inserted into a vacuum chamber of a charged particle beam system that includes a focused ion beam column, and preferably also includes an electron beam column. In step 104, a region or regions of interest of the work piece is identified, for example, using inspection data, test data, and/or CAD data. The region of interest may include, for example, one or more circuit elements such as transistors. FIG. 2A shows the work piece 202 that includes a region of interest below the dashed line 204. A volume containing the region of interest will be formed into a lamella by the ion beam.

In step 106, a protective layer (not shown) is deposited to protect the region of interest from damage during formation, extraction and thinning of the lamella. In step 108, one or more fiducials 206 are milled adjacent to the region of interest to act as reference points for aligning the ion beam for processing, or for positioning a probe.

In step 110, as shown in FIG. 2B, trenches 210 and 212 are milled on either side of the region of interest, leaving a thin lamella 214 that contains the region of interest. The lamella is typically about 200 nm to 300 nm at this point. Trench 212 is larger to allow the beam to be directed at an angle to the surface to undercut the lamella and free it from the work piece. In step 112, one or more fiducials 216 are formed on the lamella 214. Fiducials 216 are formed in the surface well away from the region of interest. Fiducials 216 can be created by milling using the FIB, or by deposition of material using either the FIB or the SEM.

The shape of fiducial 216 will vary depending on the work piece. A circle is a good choice for a fiducial for electronics because the features in electronic samples tend to be angular. For life sciences, a square fiducial may be necessary as the features of the sample tend to be round and curvy.

In step 114, the ion beam mills around the sides and bottom of the lamella as shown in FIG. 2C, cutting away most of the connection between the work piece and the lamella as shown by cut line 220, but leaving the lamella 214 attached to the work piece 202 by attachment tabs 222. In step 116, a probe is brought into proximity or contact with the lamella and in step 118, the probe tip is attached to the lamella by beam-induced deposition, sputter redeposition, an adhesive, a mechanical clamp, or some other method. Step 116 can be automated using machine vision to find and move the probe tip in relation to the lamella as described below. The process continues on FIG. 1B, step 120, in which the lamella is separated from the work piece. The separation can be performed by cutting tabs 222 using the focused ion beam. Alternatively, the separation may be performed simply by moving the probe with the lamella attached, which will physically break the tabs that are supporting the lamella within the work piece.

The lamella is moved into proximity or contact with a TEM grid in step 122, and the lamella is attached to the TEM grid in step 124. The lamella can be attached to the TEM grid by beam-induced deposition, sputter redeposition, using an adhesive, or other means. In step 126, the probe is separated by the connection between the lamella and the probe is severed, typically by ion beam milling, leaving the lamella attached to the TEM grid. Lamellae produced in accordance with the present invention are typically greater than 10 μm in width and may be as wide as 100 μm or wider. The thick regions prevent warping of the lamella.

Figure 3:
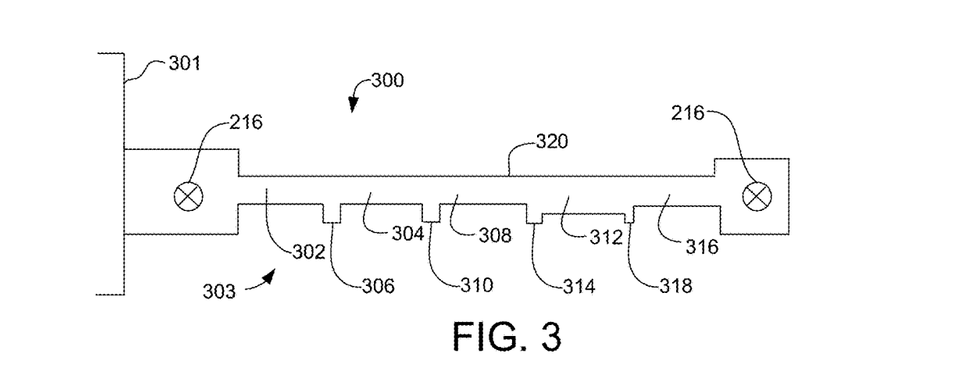
FIG. 3 is schematic illustration of a lamella having thinned regions and thicker ribs for mechanical stability.

FIG. 3 shows a top schematic view of a lamella 300 formed in accordance with an embodiment of the invention and attached to TEM grid 301. In step 130, a first region 302 of the lamella is thinned to approximately 20 nm to 80 nm on a first side 303 of lamella 300. Region 302 is preferably between about 1 μm to 5 μm wide, and more preferably between about 2 μm and 4 μm wide. The maximum width is determined by the physical strength of the lamella, which can depend on the thickness and composition. If the thin region 302 is too wide, the lamella may fall apart. Region 302 is thinned using an ion beam that is directed from the top, that is, into the page. As will be understood, because the current density in the ion beam is approximately Gaussian, the ion beam is typically directed at a small angle, such as plus or minus 1.2 degrees from the vertical, to produce a vertical side wall on the lamella. The beam is typically directed at an angle of less than 30 degrees from the vertical. Unlike prior art thin windows in lamellae, in which the window does not extend from the top to the bottom of the lamella, the ion beam in step 130 in some embodiments produces a thin region than extends from the top of the lamella to the bottom of the lamella. In other embodiments, the bottom of the lamella is slightly thicker than the area in the center of the thinned region. A thicker bottom provides additional reinforcement in horizontal direction. The thinned area may more than ½ way from the top to the bottom of the lamella, more than ¾ of the way from the top to the bottom of the lamella, or completely to the bottom of the lamella.

The ions in the beam have a landing energy of about 30 keV or less and a relatively low current. For example, at 30 keV, the current is preferably less than 300 pA, at 5 keV, the current is preferably less than 100 pA, and at 3 keV, the current is preferably less than 40 pA, and preferably about 10 pA. The beam spot size at the sample is between about 20 nm and 50 nm. For example, lower at a low current, that is, less than about 300 pA. Region 302 is thinned by executing a "mill box" on the top surface of the lamella.

After thinning region 302, the ion beam is directed to one or both of the fiducials 216 on lamella 300 to accurately determine the beam position and to adjust the position of the beam as necessary. This adjustment compensates for drift caused, for example, by thermal expansion and compression of the mechanical parts of the system and by drift in the voltages on the column caused by instabilities in the electronics. Lamella region 304 is then thinned in a similar manner in step 132. After the beam position is determined to be accurate, region 304 is milled in step 134. A thin rib 306 is left between region 304 and region 302. Rib 306 is preferably about approximately the thickness of the lamella before thinning, typically about 200 μm thick. The width of the rib is preferably as small as possible, while still providing mechanical stability, typically a few nanometers. A typical rib may be between 200 nm and 600 nm wide. The thinner the rib, the larger the portion of the sample that is thinned and can be observed. The rib prevents the lamella from deforming. Unlike the prior art windowing method, the area that is unobservable in a TEM because of the ribs is much smaller than the thin areas that are observable in the TEM. For example, the rib area may be less than ¼ of the thin area, allowing more than ¾ of the lamella to be observable on a TEM. Moreover, a larger portion of the height of the lamella is available for observation compared to the prior art windowing method.

In decision block 136, the system determines whether there are additional regions to be thinned. If so, the process repeats with 132, aligning the beam before thinning each subsequent region and leaving a thicker region between thinned regions. FIG. 3 shows additional thinned regions 308, 312 and 316 separated by ribs 310, 314, and 318. As shown in FIG. 3, not all thinned regions need to be milled to the same thickness. Region 312, for example, is thicker than region 308. The thickness can depend on the analysis to be performed on the region. For example, a thicker region may be used for energy dispersive x-ray analysis, while the thinner regions are used for electron microscopy. Steps 130 to 136 are preferably performed partly or completely automatically in accordance with a program stored in a computer readable memory. The fiducial on the lamella, which can be recognized using image recognition software, allows the program to accurately position the beam to thin regions of the lamella in accordance with the process described herein. The backside 320 of lamella can be thinned, or all thinning can be performed on the lamella. While the process described in FIG. 1B describes thinning a first thin region to a desired thickness before thinning the next thin region. In other embodiments, the beam scan encompasses all the multiple thin regions, thinning each region a little sequentially until all the regions have been thinned to their desired thicknesses.

Figure 4:
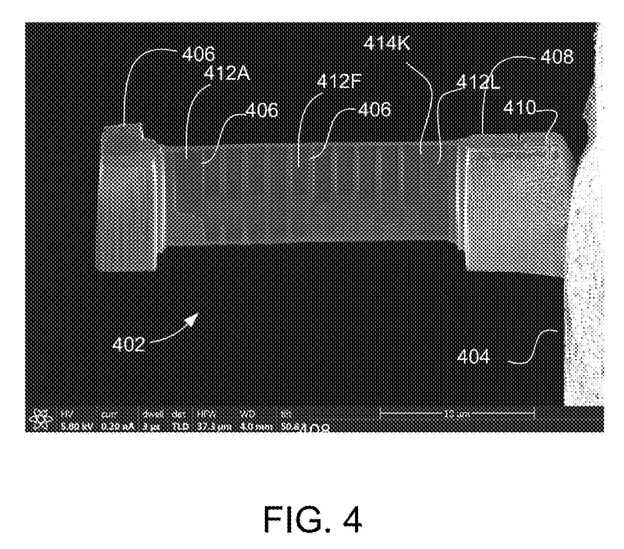
FIG. 4 is a photomicrograph of a lamella attached to a TEM grid.

FIG. 4 is a photomicrograph of a lamella 402 attached to a TEM grid 404. Lamella 402 includes thicker end portions 406 and 408. Fiducial 410 is visible on end 408. FIG. 4 shows 12 thinned regions 412A-412L, separate by thicker portions 414A-414K. (Not all regions are thinned regions and thicker portions are separately labelled in FIG. 4.)

Figure 5:
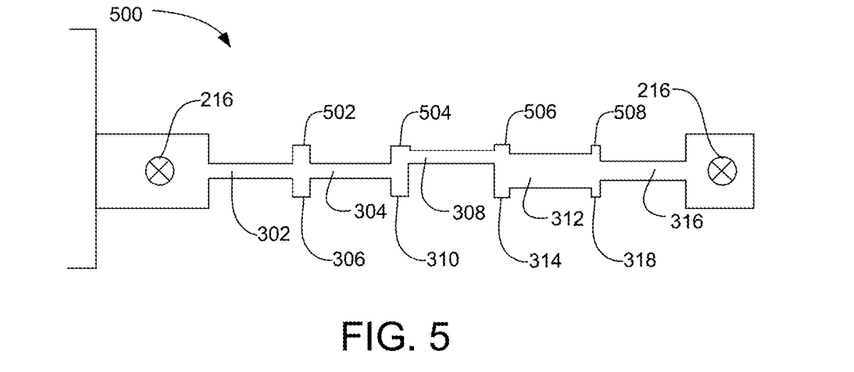
FIG. 5 is a schematic illustration of a lamella having thinned regions and thicker ribs on both sides of the lamella for mechanical stability.
Figure 6:
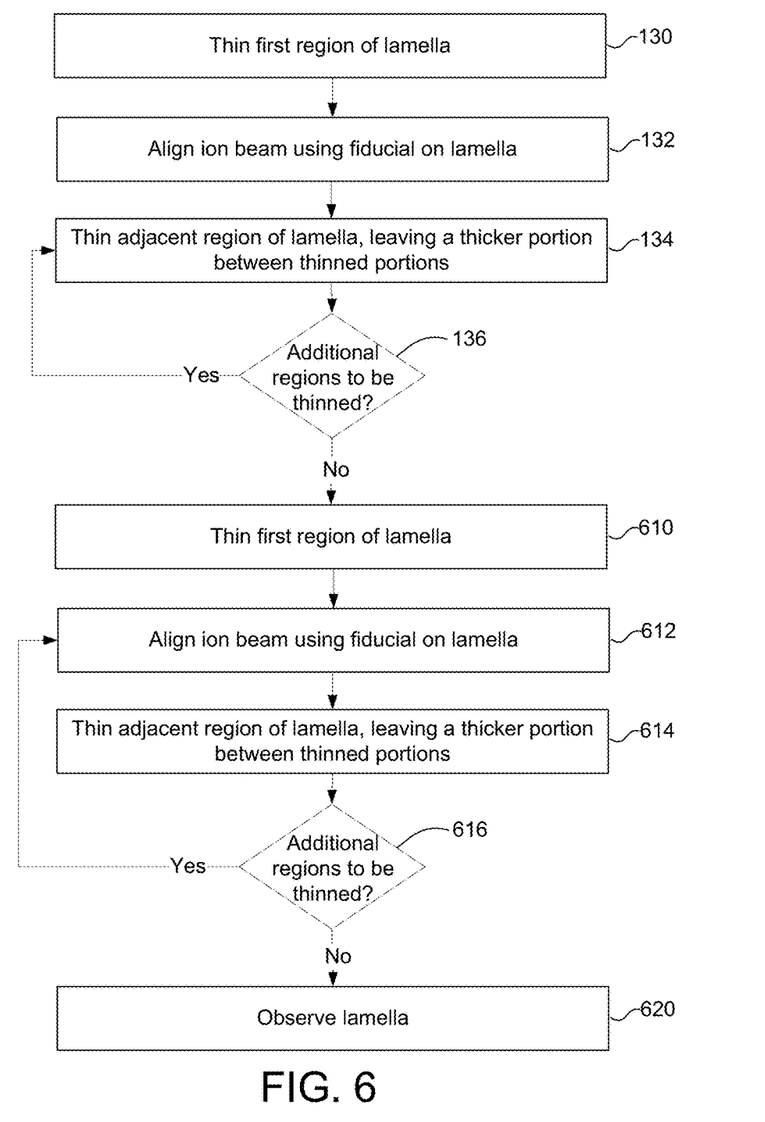
FIG. 6 is a flow chart showing the steps for producing the lamella of FIG. 5.

FIG. 5 shows a lamella 500 similar to lamella 300, but having ribs on both sides and FIG. 6 shows a flowchart for producing the lamella of FIG. 5. The process begins with steps 130 to 136 as in the process of producing the lamella of FIG. 3. In step 610, region 302 is thinned on the opposite side from the previous thinning. In step 612, the ion beam is directed toward the fiducial to determine the position of ion beam and to adjust it. In step 614, the next thin region, in this case region 304, is thinned. A region 502 is left thicker than the thinned region. In step 616, the system determined whether or not there are additional regions to be thinned. If so, the process repeats with step 612 until all the regions that are to be thinned are thinned and then the sample is observed in step 620.

The thinned regions may be positioned at different depths within the lamella. For example, a region 308 is shown offset from regions 302 and 304. Varying the position of the thinned region within the lamella increases the probability of including a very thin feature, such as a transistor or particle when there are a multiple copies of the features in a line. A region may be milled such that the thickness is not uniform across the region. For example, the thinned region may be wedge shaped, with the thickness of the region decreasing between the top of the lamella and the bottom of the lamella.

The lamella is typically thinned on the TEM grid by thinning regions all the regions separated by ribs on one side of the lamella and then optionally thinning the same regions from the other side of the lamella. Ribs can be formed on only one side, or on both sides of the lamella. Thinned regions and ribs can be formed on one side, thinning the regions to the final desired thickness, or the regions can be partially thinned, and then additional thinning can be performed on the opposite side. The thinning on the opposite can be performed uniformly over the entire side, windows and ribs can be formed on the second side also. Ribs on the second side are preferably form opposite the ribs on the first side to maximize the thin portions that are viewable on a TEM. As described above with respect to the process of FIG. 1B, the first thin region on each side can be thinned to a desired thickness before thinning the next thin region on that side or the beam scan encompasses can encompass all the multiple thin regions on a side, thinning each region on the side a little sequentially until all the regions have been thinned to their desired thicknesses. Alternatively, a thin region can be milled on one side of the lamella and then on the opposite side of the lamella, before the next thin region is milled.

Figure 7:
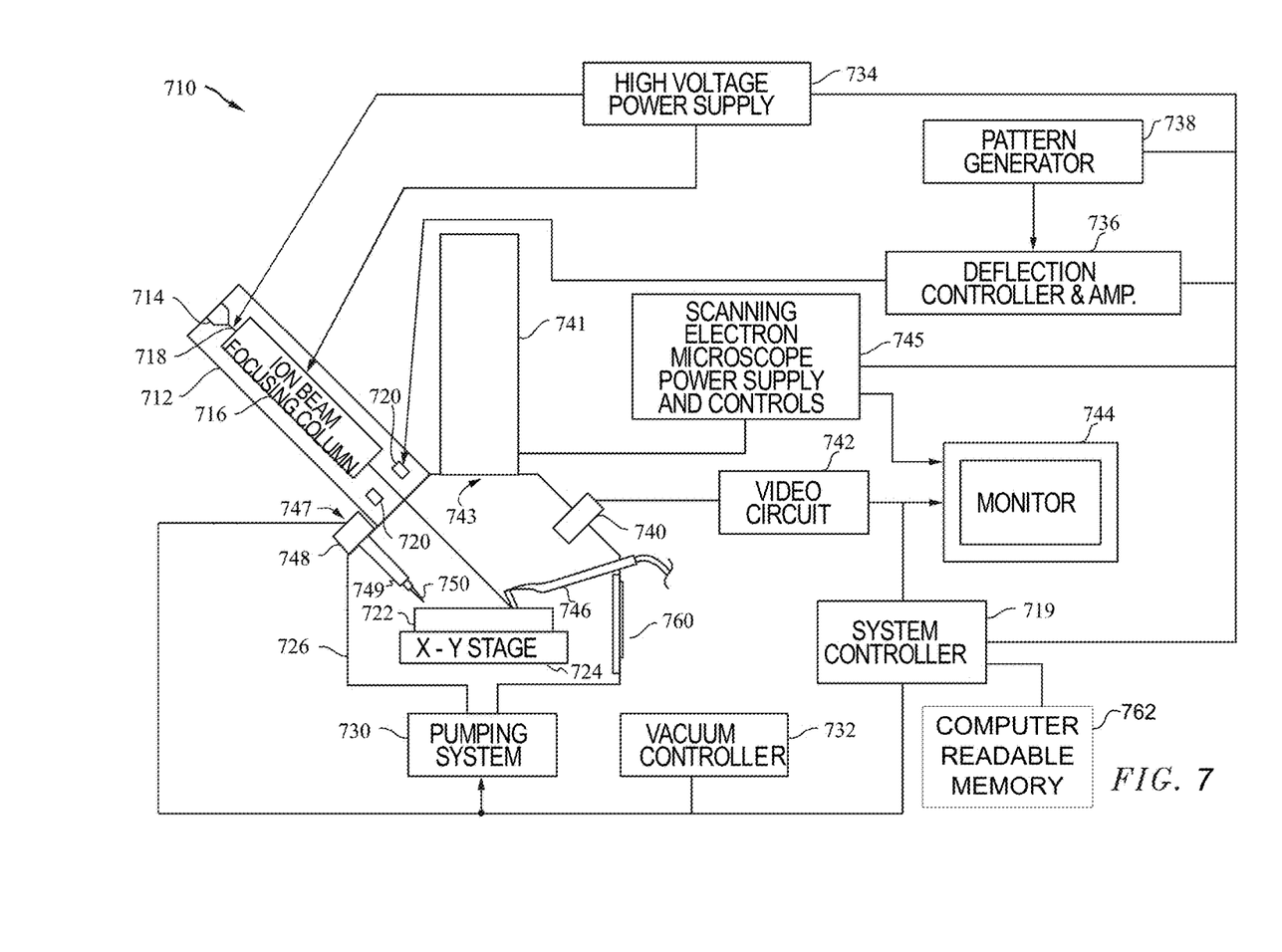
FIG. 7 is a schematic illustration of a focused ion beam system for producing lamellae.

FIG. 7 shows a typical focused ion beam that can be used to implement the present invention. FIB system 710 includes an evacuated envelope having an upper neck portion 712 within which are located a liquid metal ion source 714 or other ion source and a focusing column 716. Other types of ion sources, such as multicusp or other plasma sources, and other optical columns, such as shaped beam columns, could also be used, as well as electron beam and laser system.

An ion beam 718 passes from liquid metal ion source 714 through ion beam focusing column 716 and between electrostatic deflection means schematically indicated at deflection plates 720 toward work piece 722, which comprises, for example, a semiconductor device positioned on stage 724 within lower chamber 726. Stage 724 can also support one or more TEM sample holders, so that a sample can be extracted from the semiconductor device and moved to a TEM sample holder. Stage 724 can preferably move in a horizontal plane (X and Y axes) and vertically (Z axis). Stage 724 can also tilt approximately sixty (60) degrees and rotate about the Z axis. A system controller 719 controls the operations of the various parts of FIB system 710. Through system controller 719, a user can control ion beam 718 to be scanned in a desired manner through commands entered into a conventional user interface (not shown). Alternatively, system controller 719 may control FIB system 710 in accordance with programmed instructions stored in a computer readable memory 762, such as a RAM, ROM, or magnetic or optical disk. The memory can store instructions for carrying out the methods described above in an automated or semi-automated manner. Images from the SEM can be recognized by the software to decide when to continue processing, when to stop processing, and where to locate the beam for milling.

For example, a user can delineate a region of interest on a display screen using a pointing device, and then the system could automatically perform the steps described above to extract and form a lamella. In some embodiments, FIB system 710 incorporates image recognition software, such as software commercially available from Cognex Corporation, Natick, Mass., to automatically identify regions of interest, and then the system can manually or automatically extract samples in accordance with the invention. For example, the system could automatically locate similar features on semiconductor wafers including multiple devices, and take samples of those features on different (or the same) devices.

An ion pump (not shown) is employed for evacuating upper neck portion 712. The lower chamber 726 is evacuated with turbomolecular and mechanical pumping system 730 under the control of vacuum controller 732. The vacuum system provides within lower chamber 726 a vacuum of between approximately $1 \times 10^{-7}$ Torr ($1.3 \times 10^{-7}$ mbar) and $5 \times 10^{-4}$ Torr ($6.7 \times 10^{-4}$ mbar). If an etch-assisting gas, an etch-retarding gas, or a deposition precursor gas is used, the chamber background pressure may rise, typically to about $1 \times 10^{-5}$ Torr ($1.3 \times 10^{-5}$ mbar).

High voltage power supply 734 is connected to liquid metal ion source 714 as well as to appropriate electrodes in ion beam focusing column 716 for forming an approximately 1 keV to 60 keV ion beam 718 and directing the same toward a sample. Deflection controller and amplifier 736, operated in accordance with a prescribed pattern provided by pattern generator 738, is coupled to deflection plates 720 whereby ion beam 718 may be controlled manually or automatically to trace out a corresponding pattern on the upper surface of work piece 722. In some systems the deflection plates are placed before the final lens, as is well known in the art. Beam blanking electrodes (not shown) within ion beam focusing column 716 cause ion beam 718 to impact onto blanking aperture (not shown) instead of target 722 when a blanking controller (not shown) applies a blanking voltage to the blanking electrode.

The liquid metal ion source 714 typically provides a metal ion beam of gallium. The source typically is capable of being focused into a sub one-tenth micrometer wide beam at work piece 722 for either modifying the work piece 722 by ion milling, enhanced etch, material deposition, or for the purpose of imaging the work piece 722. A charged particle detector 740, such as an Everhart Thornley or multi-channel plate, used for detecting secondary ion or electron emission is connected to a video circuit 742 that supplies drive signals to video monitor 744 and receiving deflection signals from controller 719.

The location of charged particle detector 740 within lower chamber 726 can vary in different embodiments. For example, a charged particle detector 740 can be coaxial with the ion beam and include a hole for allowing the ion beam to pass. In other embodiments, secondary particles can be collected through a final lens and then diverted off axis for collection. A scanning electron microscope (SEM) 741, along with its power supply and controls 745, are optionally provided with the FIB system 710.

A gas delivery system 746 extends into lower chamber 726 for introducing and directing a gaseous vapor toward work piece 722. U.S. Pat. No. 5,851,413 to Casella et al. for "Gas Delivery Systems for Particle Beam Processing," assigned to the assignee of the present invention, describes a suitable gas delivery system 746. Another gas delivery system is described in U.S. Pat. No. 5,435,850 to Rasmussen for a "Gas Injection System," also assigned to the assignee of the present invention. For example, iodine can be delivered to enhance etching, or a metal organic compound can be delivered to deposit a metal.

A micromanipulator 747, such as the EasyLift NanoManipulator System from FEI Company, the present applicant, can precisely move objects within the vacuum chamber. Micromanipulator 747 may comprise precision electric motors 748 positioned outside the vacuum chamber to provide X, Y, Z, and theta control of a portion 749 positioned within the vacuum chamber. The micromanipulator 747 can be fitted with different end effectors for manipulating small objects. In the embodiments described below, the end effector is a thin probe 750. The thin probe 750 may be electrically connected to system controller 719 to apply an electric charge to the probe 750 to control the attraction between a sample and the probe.

A door 760 is opened for inserting work piece 722 onto X-Y stage 724, which may be heated or cooled, and also for servicing an internal gas supply reservoir, if one is used. The door is interlocked so that it cannot be opened if the system is under vacuum. The high voltage power supply provides an appropriate acceleration voltage to electrodes in ion beam focusing column 716 for energizing and focusing ion beam 718. When it strikes work piece 722, material is sputtered, that is physically ejected, from the sample. Alternatively, ion beam 718 can decompose a precursor gas to deposit a material. Focused ion beam systems are commercially available, for example, from FEI Company, Hillsboro, Oreg., the assignee of the present application. While an example of suitable hardware is provided above, the invention is not limited to being implemented in any particular type of hardware. Producing a lamella in accordance with the methods described herein do not require implantation of beryllium or other ions to alter the etch rate of some portions of the sample relative to other portions of the sample.

The techniques described herein makes the process of lamellae creation more reproducible, increasing the success rate. While the desired width of the reinforcing structures will vary with the specific application, the minimum width of the strengthened region is limited only by the resolution of the spot size of the implanting beam, or other material placement method.

Some embodiments for lamella preparation could be applied to samples that are thinned in the vacuum chamber but removed from the substrate outside the vacuum chamber (ex-situ-type samples) or to samples extracted from the substrate and thinned after mounting on a TEM grid inside the vacuum chamber (in-situ-type samples).

The embodiments will vary greatly depending upon the specific application, and not every embodiment will provide all of the benefits and meet all of the objectives that are achievable by the invention. Particle beam systems suitable for carrying out the present invention are commercially available, for example, from FEI Company, the assignee of the present application.

It should be recognized that an apparatus performing the operation of such a method would further be within the scope of the present invention.

Whenever the terms "automatic," "automated," or similar terms are used herein, those terms will be understood to include manual initiation of the automatic or automated process or step. In the following discussion and in the claims, the terms "including" and "comprising" are used in an open-ended fashion, and thus should be interpreted to mean "including, but not limited to . . . ." The term "integrated circuit" refers to a set of electronic components and their interconnections (internal electrical circuit elements, collectively) that are patterned on the surface of a microchip. The term "semiconductor device" refers generically to an integrated circuit (IC), which may be integral to a semiconductor wafer, simulated from a wafer, or packaged for use on a circuit board. The term "FIB" or "focused ion beam" is used herein to refer to any collimated ion beam, including a beam focused by ion optics and shaped ion beams.

To the extent that any term is not specially defined in this specification, the intent is that the term is to be given its plain and ordinary meaning. The accompanying drawings are intended to aid in understanding the present invention and, unless otherwise indicated, are not drawn to scale. By microscopic is meant on a scale smaller than millimeters, such as a scale of microns or a scale of nanometers.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follow:

1. A method for preparing a thin, reinforced lamellar structure using a charged particle beam system, comprising:
   directing a charged particle beam toward a work piece to form a lamella having a thickness of less than 300 nm;
   extracting the lamella from the work piece;
   attaching the lamella to a TEM grid;
   directing the charged particle beam to mill a first region on a first side of the lamella, each point in the first milled region receiving a dose of ions from the charged particle beam;
   directing the charged particle beam to mill a second region on the first side of the lamella, each point in the second milled region receiving a dose of ions from the charged particle beam; and
   the first region and the second region being separated by a third region having a thickness greater than the thickness of the first region or of the second region, the points in the third region receiving a dose of ions that is less than the dose of ions received at points in the first region or the second region, thereby producing a reinforcing rib between the first region and the second region to mechanically strengthen the lamella.

2. The method of claim 1, in which directing a charged particle beam toward a work piece to form a lamella comprises directing a charged particle beam toward a work piece to form a lamella having a width greater than 8 μm.

3. The method of claim 2 in which the lamella has a width of greater than 20 μm.

4. The method of claim 2 in which the lamella has a width of between 8 μm and 50 μm.

5. The method of claim 1, in which the thickness of the third region is greater than 5% thicker than the greater of the thickness of the first region and the second region.

6. The method of claim 1, in which the thicknesses of the first region and the second region are less than 20 nm.

7. The method of claim 1, further comprising:
forming a fiducial on the lamella; and
after directing the charged particle beam toward points in a first region of the lamella and before toward points in a first region of the lamella, directing the charged particle beam toward the fiducial to align the charged particle beam with the lamella.

8. The method of claim 1, further comprising:
directing the charged particle beam toward points in a fourth region of the lamella, each point in the fourth region receiving a dose of ions from the charged particle beam; and
the second region and the fourth regions being separated by a fifth region having a thickness greater than the thickness of the second region or of the fourth region, the points in the fifth region receiving a dose of ions that is less than the dose of ions received at points in the second region or the fourth region, thereby producing reinforcing ribs between the second region and the fourth region to mechanically strengthen the lamella.

9. The method of claim 1, in which directing the charged particle beam toward points in a first region of the lamella and directing the charged particle beam toward points in a second region of the lamella, comprise directing the beam at an angle of less than 30 degrees to the surface of the lamella.

10. The method of claim 1, directing the charged particle beam toward points in a first region of the lamella and directing the charged particle beam toward points in a second region of the lamella produce a first region having the same thickness as the second region.

11. The method of claim 1, directing the charged particle beam toward points in a first region of the lamella and directing the charged particle beam toward points in a second region of the lamella produce a first region having a different thickness from the second region.

12. The method of claim 1 further comprising:
directing the charged particle beam to mill the first region on a second side of the lamella, each point on the second side of the lamella in the first milled region receiving a dose of ions from the charged particle beam;
directing the charged particle beam to mill a second region on the first side of the lamella, each point in the second milled region receiving a dose of ions from the charged particle beam;
the first region and the second region being separated by a third region having a thickness greater than the thickness of the first region or of the second region, the points in the third region receiving a dose of ions that is less than the dose of ions received at points in the first region or the second region, thereby producing reinforcing ribs between the first region and the second region to mechanically strengthen the lamella; and
point receiving a dose of ions from the charged particle beam.

13. The method of claim 1 further comprising further comprising repeatedly directing the charged particle beam toward the work piece to mill at least one additional thin region separated from the first or second region by a thicker region having a width less than 3 μm.

14. A method for preparing a thin, reinforced lamellar structure using a charged particle beam system, comprising:
directing a charged particle beam toward a work piece to form a lamella having a thickness of less than 300 nm;
extracting the lamella from the work piece;
attaching the lamella to a TEM grid;
directing the charged particle beam toward the top of the lamella to mill a first region on a first side of the lamella, the charged particle beam milling from the top of the lamella to the bottom of the lamella;
directing the charged particle beam to mill a second region on the first side of the lamella, the charged particle beam milling from the top of the lamella to the bottom of the lamella; and
the first region and the second region being separated by a third region having a thickness greater than the thickness of the first region or of the second region, thereby producing a reinforcing rib between the first region and the second region to mechanically strengthen the lamella.

15. The method of claim 14 further comprising repetitively directing the charged particle beam to the top of the lamella to mill additional thin regions on the lamella, the additional thin regions extending from the top of the lamella to the bottom of the lamella, the thin regions being separated by thick regions.

16. The method of claim 15 in which one or more of the additional thin regions are less than 50 nm thick and in which the thick regions are greater than 75 nm thick.

17. A lamella for viewing on a transmission electron microscope, the sample comprising:
an edge portion at both sides of the lamella, the edge portions having thicknesses of between 100 nm and 400 nm;
multiple thin regions having thicknesses of less than 100 nm; and
multiple thicker regions separating the thin regions, the multiple thin regions extending from the top of the lamella to the bottom of the lamella.

18. The lamella of claim 17 in which the multiple thin regions comprise more than 5 thin regions.

19. The lamella of claim 18 in which the multiple thin regions comprise more than 10 thin regions.

20. The lamella of claim 17 in which the multiple thin regions each has the same thickness.

21. The lamella of claim 17 in which at least one of the multiple thin regions has a thickness different from the thickness of another one of the multiple thin regions.

22. The lamella of claim 17 in which the multiple thicker regions have a width of less than ¼ the width of the thin regions.

23. The lamella of claim 17 in which at least one of the multiple thin regions has a non-uniform thickness.

* * * * *